United States Patent

Hakamata et al.

[11] Patent Number: 5,133,825
[45] Date of Patent: Jul. 28, 1992

[54] PLASMA GENERATING APPARATUS

[75] Inventors: Yoshimi Hakamata; Ken-ichi Natsui; Yukio Kurosawa, all of Hitachi; Tadashi Sato, Mito; Hiroaki Kojima, Hitachi; Yasunori Ohno, Hitachi; Tomoe Kurosawa, Hitachi, all of Japan

[73] Assignee: Hi Tachi, Ltd., Tokyo, Japan

[21] Appl. No.: 178,613

[22] Filed: Apr. 7, 1988

[30] Foreign Application Priority Data

| Apr. 8, 1987 [JP] | Japan | 62-86664 |
| May 8, 1987 [JP] | Japan | 62-110750 |
| Sep. 7, 1987 [JP] | Japan | 62-222124 |

[51] Int. Cl.⁵ .............................. H01L 21/00
[52] U.S. Cl. .................... 156/345; 156/643; 156/646; 115/723
[58] Field of Search .............. 156/345, 643, 646; 427/39, 40, 41, 45.1; 118/723

[56] References Cited

U.S. PATENT DOCUMENTS

| 3,911,318 | 10/1975 | Spero et al. | 315/39 |
| 4,101,411 | 7/1978 | Suzuki et al. | 219/121.43 |
| 4,125,431 | 11/1978 | Fowler | 176/3 |
| 4,483,737 | 11/1984 | Mantei | 156/643 |
| 4,543,266 | 9/1985 | Matsuo et al. | 427/38 |
| 4,564,997 | 1/1986 | Matsuo et al. | 427/38 |
| 4,599,135 | 7/1986 | Tsunekawa et al. | 427/38 |
| 4,683,838 | 8/1987 | Kimura et al. | 427/39 |
| 4,691,662 | 9/1987 | Roppel et al. | 427/41 |
| 4,724,159 | 2/1988 | Yamazaki | 427/45.1 |
| 4,727,293 | 2/1988 | Asmussen et al. | 315/111.41 |
| 4,732,761 | 3/1988 | Machida et al. | 427/38 |
| 4,745,337 | 5/1988 | Pichot et al. | 315/111.41 |
| 4,778,561 | 10/1988 | Ghanbari | 156/643 |
| 4,838,978 | 6/1989 | Sekine et al. | 156/345 |

FOREIGN PATENT DOCUMENTS

| 0209469 | 1/1987 | European Pat. Off. | |
| 56-112477 | 4/1981 | Japan . | |
| 56-152969 | 11/1981 | Japan . | |
| 57-177975 | 11/1982 | Japan . | |
| 61-213377 | 9/1986 | Japan . | |
| 61-288348 | 12/1986 | Japan . | |
| 62-30891 | 9/1987 | Japan . | |
| 0250821 | 10/1988 | Japan | 156/345 |
| 0284819 | 11/1988 | Japan | 156/345 |
| 0004023 | 1/1989 | Japan | 156/345 |
| 0008624 | 1/1989 | Japan | 156/345 |
| 0020621 | 1/1989 | Japan | 156/345 |
| 0032631 | 2/1989 | Japan | 156/345 |

Primary Examiner—Thi Dang
Attorney, Agent, or Firm—Antonelli, Terry, Stout & Kraus

[57] ABSTRACT

An apparatus for generating plasma by making use of electron cyclotron resonance employs permanent magnets for forming magnetic fields, and the permanent magnets are arranged in such a manner as to form stronger magnetic fields in peripheral portion of a plasma chamber than in a central portion of the same. in addition, a cross-sectional area of the plasma chamber is gradually increased. Furthermore, electrons are introduced into an additional plasma chamber in which an electric field is not applied so as to generate low-temperature plasma.

8 Claims, 8 Drawing Sheets

PLASMA GENERATING APPARATUS

BACKGROUND OF THE INVENTION

1. Field of the Invention

The present invention relates to a plasma generating apparatus for deposition or etching of thin films in semiconductor circuit devices or the like.

2. Description of the Related Art

In processing of thin films in which lines of submicron widths are formed, such as in semiconductor circuit devices, a shift has taken place from wet etching in which a solution is used to dry etching in which plasma is used, in order to improve the processing accuracy. The plasma is required to have a high degree of purity in order to effect high-accuracy processing. If arc discharge or the like is used as a plasma generating apparatus, metallic impurities are mixed in the plasma, so that high-frequency electric fields of microwaves or the like have come to be used increasingly without using electrodes. For instance, in Japanese Patent Unexamined Publication No. 56-152969, microwaves are introduced into a plasma generating chamber through a waveguide to generate plasma, electromagnets are disposed around the plasma generating chamber to form in the plasma chamber magnetic fields having the same direction as the advancing direction of the microwaves, and electron cyclotron resonance is made to take place in the chamber so as to produce the plasma effectively. In addition, positive ions are taken out through ion extraction electrodes while they are being accelerated, and this ion beam is used to effect deposition, etching or the like of thin films. In this case, however, the intensity of magnetic fields produced by the electromagnets is substantially uniform in the radial direction inside the plasma chamber, while the intensity of the electromagnetic fields of microwaves led through the waveguide is strong in the axis of the plasma chamber and is weaker toward the side wall of the plasma chamber. Accordingly, plasma is generated mainly in a central portion of the plasma generating chamber and is diffused toward the periphery thereof, is collided against the side walls, and is hence recombined. Therefore, the distribution of the density of the plasma in the plasma generating chamber is thick in the central portion, and that of the ion beam taken therefrom through the extraction electrodes become non-uniform. This non-uniformity is undesirable in the deposition or etching of thin films. Furthermore, the cross-sectional area of the plasma chamber cannot be made very large since it is restricted by the cross-sectional area of the waveguide in the light of the propagation efficiency of the microwaves. Although a large diameter of the plasma generating chamber would be advantageous in that a large number of workpieces can be processed simultaneously, it is impossible to obtain this advantage. Japanese Patent Unexamined Publication No. 56-112477 discloses means for generating plasma having a large diameter. In this means, however, the plasma is generated and expanded inside an internal conductor of a coaxial waveguide, so that impurities from a wall surface of the internal conductor are mixed in, and the purity of the plasma therefore declines. Furthermore, Japanese Patent Unexamined Publication No. 61-288348 provides the following arrangement: The plasma which is obtained by the discharge of microwaves, such as those described above, is used as a plasma cathode, a main plasma chamber is provided such as to be disposed adjacent to the plasma cathode, a cathode is provided at an inlet port of the main chamber adjacent to the plasma chathode, an anode is provided on a side wall of the main plasma chamber, electrons are taken out from the plasma cathode, a DC discharge is performed in the main plasma chamber, and a some part of gas to the chamber is converted into plasma, thereby obtaining plasma of a large diameter. In this arrangement, however, positive ions inside the main plasma chamber collide against the cathode, and sputtering consequently occurs, thereby disadvantageously resulting in a decline in the purity of the plasma.

SUMMARY OF THE INVENTION

Accordingly, an object of the present invention is to provide a plasma generating apparatus which is capable of generating high-purity plasma, in which the density of the plasma is uniformly distributed, and whose diameter is large, thereby overcoming the above-described drawbacks of the prior arts.

In the present invention, not magnetic coils but permanent magnets are arranged around an outer periphery of a plasma generating chamber as a device for producing magnetic fields for causing electron cyclotron resonance, and stronger magnetic fields are formed in a peripheral portion of the plasma generating chamber than in a central portion thereof, and the plasma is formed mainly in the peripheral portion and is diffused toward the central portion, thereby making the distribution of the plasma density uniform. In addition, a cross-sectional area of the plasma chamber is continuously increased from a microwave induced portion in the advancing direction of microwaves so as to form a large diameter of the plasma. Furthermore, electrons introduced by means of extraction electrodes into an additional plasma chamber from a plasma cathode obtained by electron cyclotron resonance or the like are made to travel without a DC voltage being applied thereto, and high-purity plasma which has a large diameter and is not subjected to damage caused by sputtering is generated in the additional plasma chamber.

Other and further objects, features and advantages of the invention will appear more fully from the following description.

DETAILED DESCRIPTION OF THE PREFERRED EMBODIMENTS

Referring now to the accompanying drawings, a description will be given of preferred embodiments of the present invention.

Figure 1:
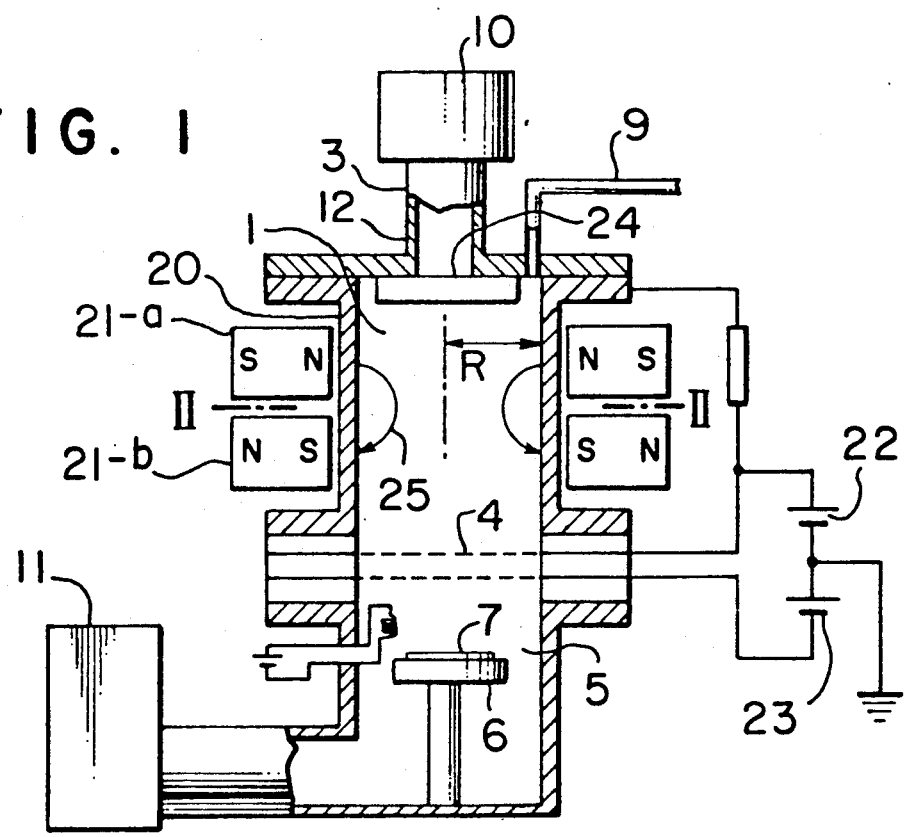
FIG. 1 is a vertical cross-sectional view of a plasma generating apparatus in accordance with an embodiment of the present invention.

In FIG. 1, a substrate holder 6 is provided in a vacuum vessel 5 having a vacuum exhaust device 11, and a plasma generating chamber 1 is provided such as to oppose the substrate holder 6. A pair of hollow disk-shaped rare earth magnets 21a, 21b are provided around an outer periphery of a vessel wall 20 of the plasma generating chamber 1. These permanent magnets are disposed in tandem, and the upper permanent magnet 21a and the lower permanent magnet 21b are disposed in such a manner that mutually different polarities face the side of the vessel, as shown in FIG. 1. A microwave transmissive window 24 is provided in one end plate of the plasma generating chamber 1, while a waveguide 3 is installed adjacently to the window, and a microwave generator 10, such as a magnetron, is provided on the waveguide 3.

Meanwhile, a pair of extraction electrodes 4 each provided with a multi-aperture opposite to each other are disposed at the other end of the plasma generating chamber 1. Appropriate potentials are applied to the extraction electrodes 4 by DC power supplies 22, 23. The permanent magnets 21a, 21b are annular magnets that are magnetized radially in the mutually reverse directions and generate lines 25 of magnetic force substantially symmetrically about an axis thereof. The waveguide 3 which guides microwaves is installed in a direction along this symmetrical axis. The direction of oscillation of the microwaves is perpendicular to the advancing direction of the microwaves, and is also perpendicular to the aforementioned lines of magnetic force.

The frequency of the microwaves is assumed to be 2.45 GHz, and an arrangement is made such that axial components of the magnetic fields generated by the permanent magnets become 0.0875 tesla or higher in the vicinity of a vessel wall surface of the plasma generating chamber. According to a calculation made by the inventors, if rare earth element-based magnets each having an inside diameter of approx. 100 mm, an outside diameter of approx. 150 mm, a thickness of approx. 8 mm, and a residual magnetic flux density of 0.9 tesla are arranged at an interval of 30 mm or thereabout, it is readily possible to obtain a magnetic field intensity of 0.0875 tesla or higher.

The radial distribution of the magnetic field intensity produced by the permanent magnets is determined by a ratio between the interval between the upper and lower magnets and a diameter of the plasma generating chamber. This ratio is selected in such a manner that the magnetic field density becomes higher in the peripheral portion than in the central portion. As a result, a region whose magnetic field intensity is 0.0875 tesla, in which the frequency of the electron cyclotron resonance and the frequency of the microwaves coincide with each other, is formed annularly on the inner side of the vessel wall.

In this state, an etching gas, e.g. $CF_4$ (Tetrafluoromethane), is supplied at an appropriate pressure (generally $10^{-5}$ to $10^{-3}$ torr). At this time, in the above-described annular electron cyclotron resonant region, electrons are accelerated strongly by the electron cyclotron resonance. These electrons collide against molecules of the gas and ionization takes place as a result. Hence, thick plasma is generated in the vicinity of the vessel wall. In addition, since the plasma is diffused to the central portion of the plasma chamber, plasma in a uniformly distributed state is formed.

Figure 2:
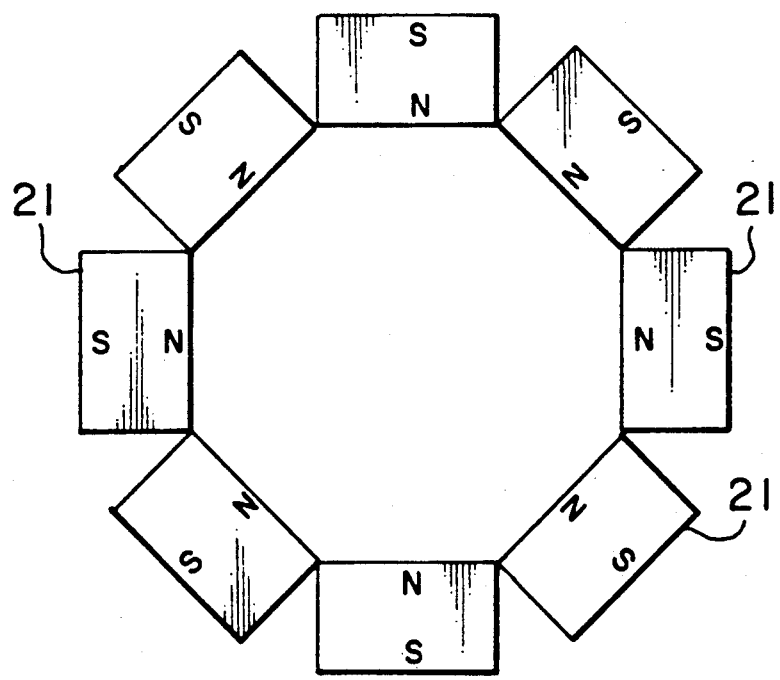
FIG. 2 is a top plan view of an example of the arrangement of permanent magnets in accordance with the present invention.

Incidentally, the above-described permanent magnets are not restricted to hollow disk-shaped ones, but, as shown in FIG. 2, a plurality of rectangular parallelepiped magnets 21 may be arranged in the form of a polygon.

Figure 3:
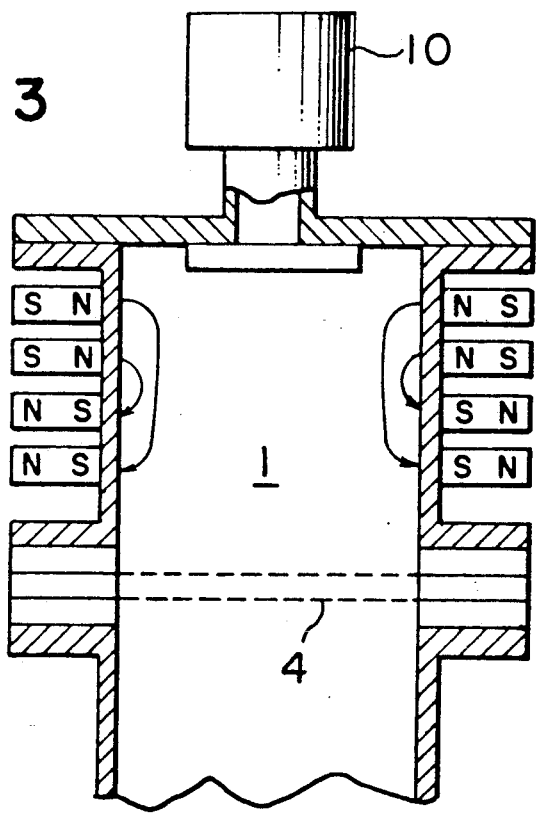
FIGS. 3 and 4 are vertical cross-sectional views of other examples of the arrangement of the permanent magnets in accordance with the present invention.

In the apparatus shown in FIG. 3, instead of the pair of magnets illustrated in FIG. 1, four magnets are used, in which two magnets whose inwardly oriented polarities are identical are respectively arranged adjacent to each other (in the order of N-N-S-S).

When such an arrangement of the magnets is adopted, it is possible to establish a magnetic field region which produces axially elongated electron cyclotron resonance inside the plasma generating chamber by using relatively small magnets.

Figure 4:
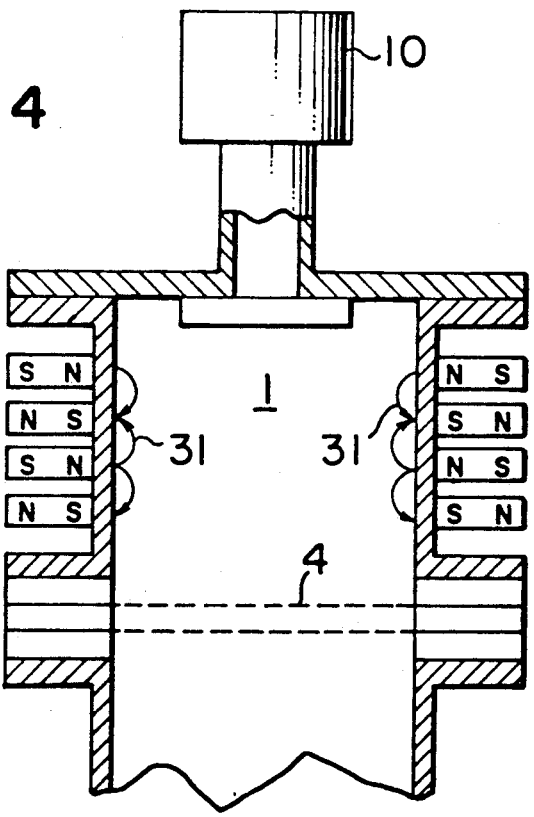

Although the apparatus shown in FIG. 4 is similar to that shown in FIG. 3, the magnets are arranged such that adjacent magnets have mutually different polarities. As a result, a cusp magnetic field 31 is formed in the vicinity of the vessel wall inside the plasma generating chamber 1, where plasma is generated as a result of the electron cyclotron resonance.

In the case of a plasma generating apparatus having such an arrangement of magnets, since the magnetic fields produced by the magnets are confined to the vicinity of the magnets, the ion beam extracted from the plasma is not disturbed.

Figure 5:
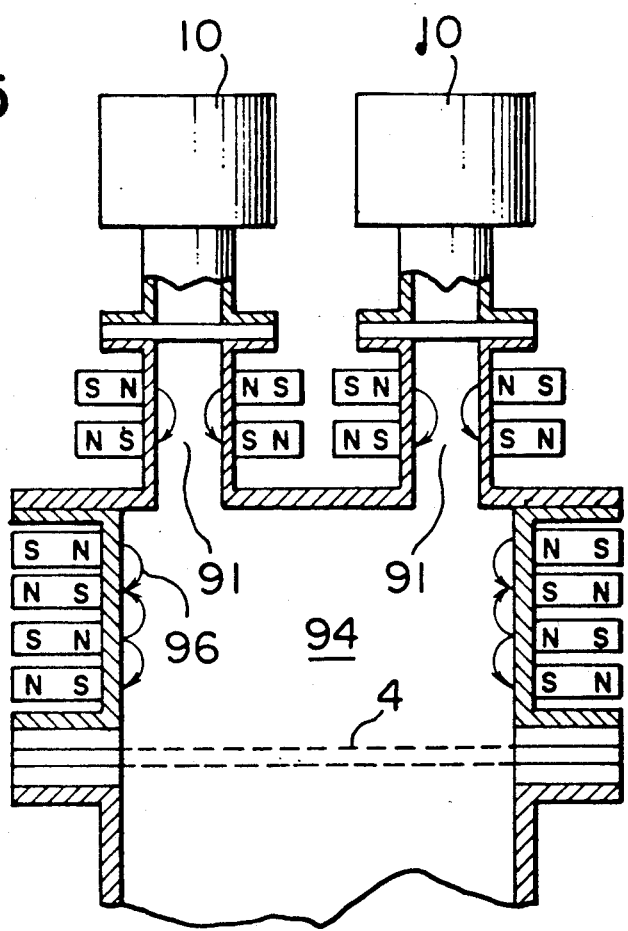
FIG. 5 is a vertical cross-section view of an embodiment in which a plurality of preliminary plasma chambers are provided.

The apparatus illustrated in FIG. 5 is provided with a plurality of microwave generators 10 and preliminary plasma chambers 91 with respect to one main plasma chamber 94. The plasma produced in the preliminary plasma chambers 91 is confined in the main plasma chamber 94 by means of cusp fields 96 formed by magnets having different polarities alternately. Each of the magnetic fields 96 acts with the microwaves leaking from the preliminary plasma chambers 91, so as to produce plasma in the peripheral portion of the main plasma chamber 94. This plasma is also diffused toward the central portion of the main plasma chamber 94. Thus, high density and uniform plasma is accumulated in the main plasma chamber 94. In this embodiment, as for the size of the main plasma chamber 94, it is readily possible to enlarge the diameter of the plasma chamber 94 by increasing the number of the preliminary plasma chambers 91.

In each of the examples described above, the ion beam is extracted from the plasma chamber by using the extraction electrodes 4 and is applied to the workpiece. However, it is also possible to directly place the workpiece inside the plasma chamber and conduct plasma etching or plasma CVD.

Figure 9:
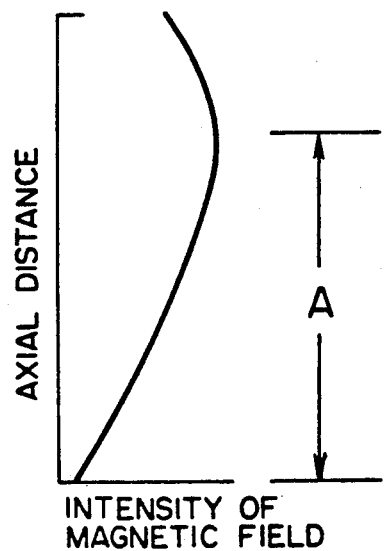
FIG. 9 is a graph illustrating the distribution of the intensity of magnetic fields in a plasma generating chamber.
Figure 6:
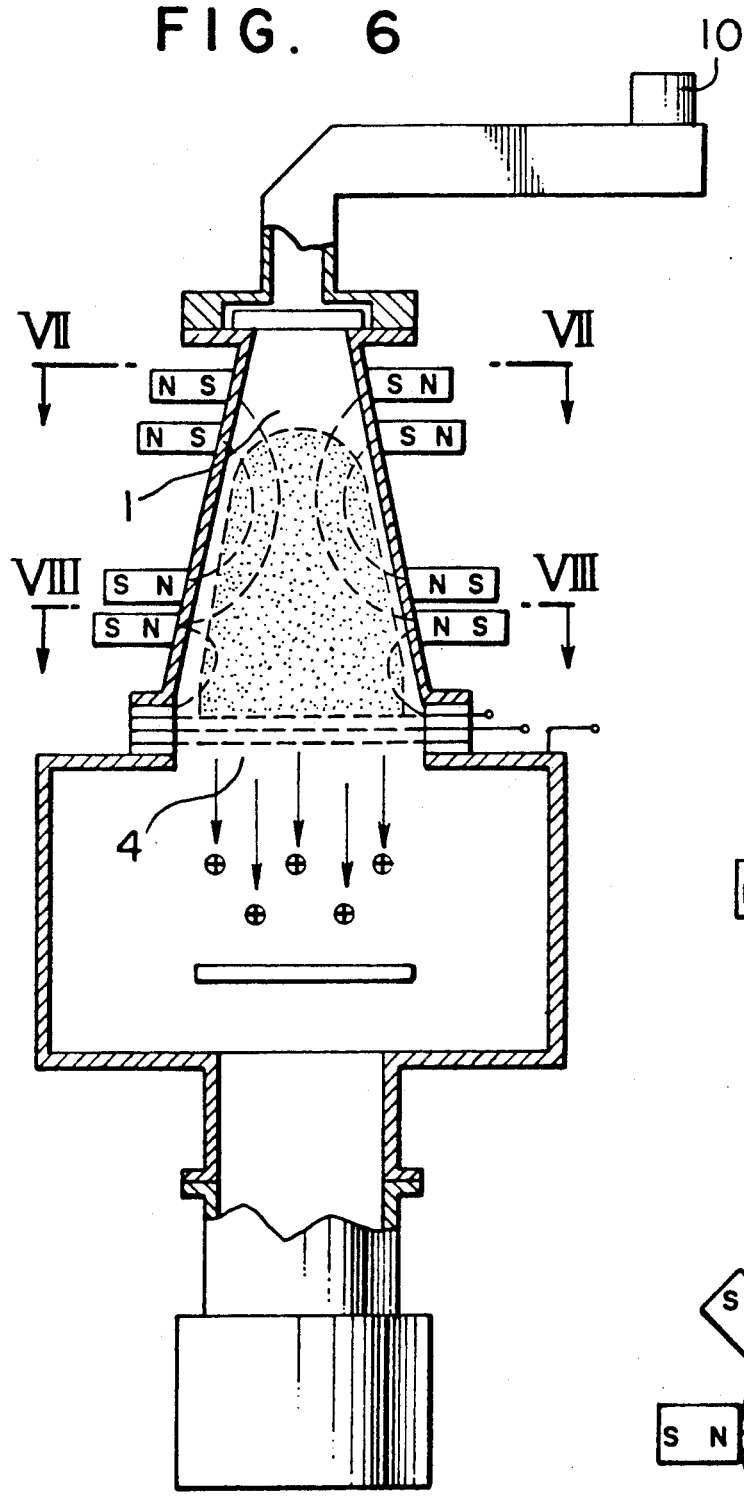
FIG. 6 is a vertical cross-sectional view of an embodiment in which a cross-sectional area of plasma is increased gradually.
Figure 7:
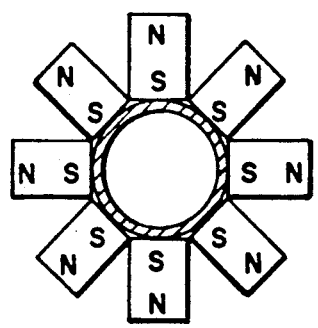
FIGS. 7 and 8 are cross-sectional views taken along the lines VII—VII and VIII—VIII of FIG. 6, respectively.
Figure 8:
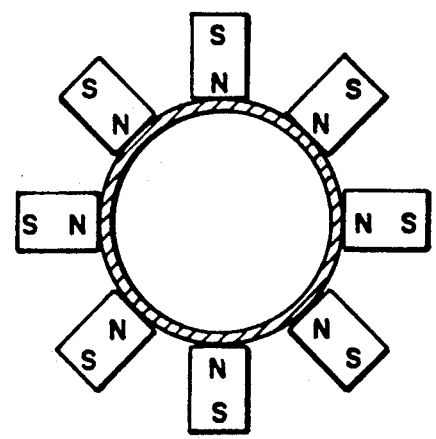

In the apparatus shown in FIG. 6, the cross-sectional area of the plasma generating chamber is substantially continuously increased from the waveguide-connecting side to the ion extraction side. In addition, the arrangement of the permanent magnets corresponds to that shown in FIG. 3, and the number of the magnets arranged around the outer periphery of the plasma chamber is identical regardless of a change in the cross-sectional area of the plasma chamber, as shown in FIGS. 7 and 8. Accordingly, the average intensity of the magnetic fields inside the plasma generating chamber becomes maximal at an axial position offset to the waveguide, as shown in FIG. 9, and a region A in which the magnetic field intensity decreases gradually toward the ion-extraction side is formed. Since the cross-sectional area of the plasma chamber is gradually increased, it is possible to introduce the microwaves into the plasma chamber with a small loss and obtain a large ion-extraction area. In addition, the plasma which is generated in the plasma chamber is pushed to the ion-extraction side by virtue of the action of the gradient in the magnetic field intensity in the aforementioned region A. Thus a large diameter plasma is obtained efficiently for the plasma chamber.

Figure 10:
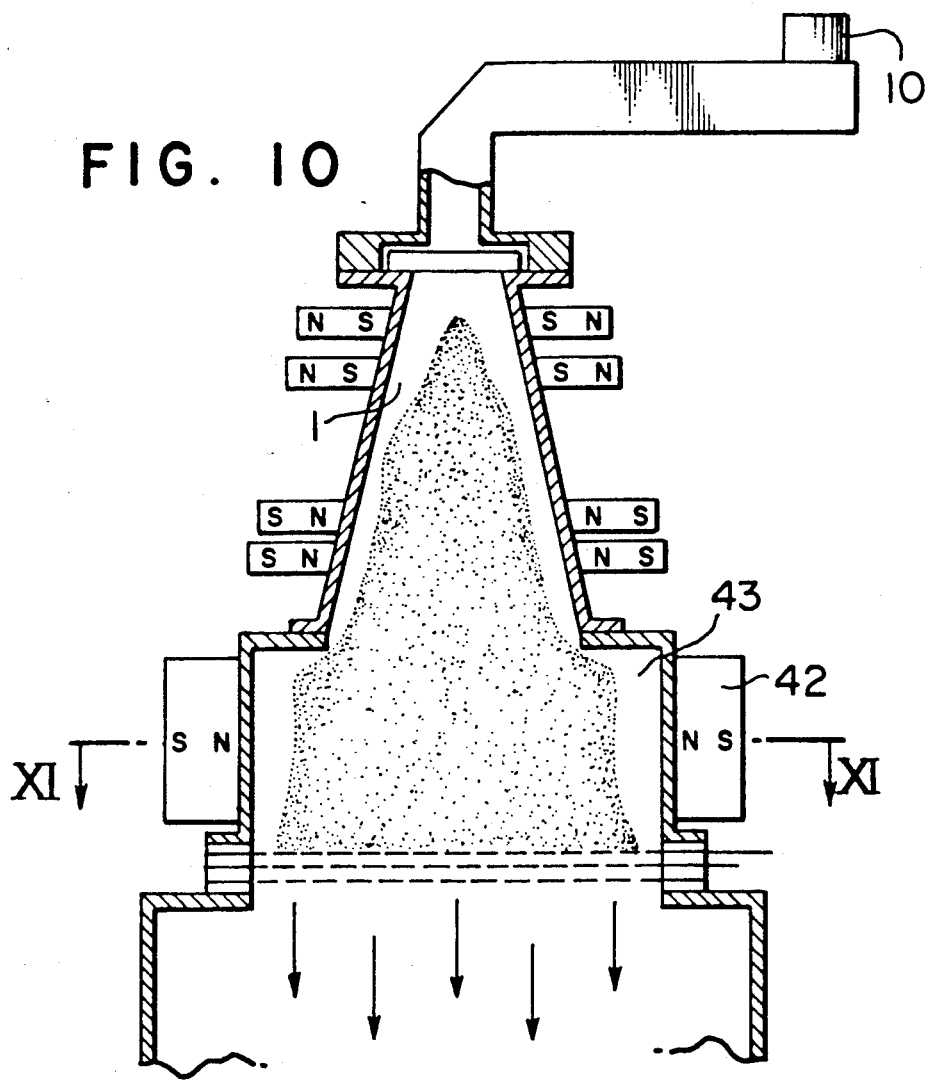
FIG. 10 is a vertical cross-sectional view of an embodiment in which a plasma expanding chamber is provided below the plasma chamber shown in FIG. 6.
Figure 11:
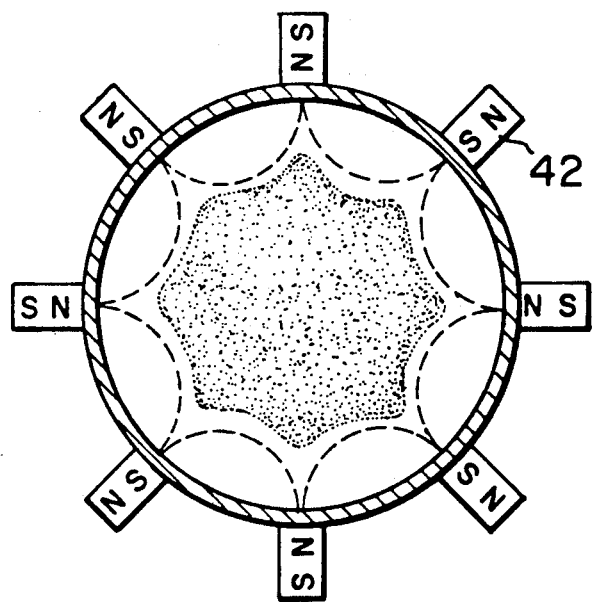
FIG. 11 is a cross-sectional view taken along the line XI—XI of FIG. 10.

In the apparatus shown in FIG. 10, a plasma expanding chamber 43 is provided underneath the plasma generating chamber shown in FIG. 6, and permanent magnets 42 arranged with alternate polarities are provided around an outer periphery of the plasma expanding chamber, as shown in FIG. 11, so as to form cusp magnetic fields in a peripheral portion of the expanding chamber. The cusp fields confine the plasma inside the expanding chamber with the periphery thereof separated from the wall surface of the expanding chamber, with the result that it is possible to obtain high-purity plasma whose density is made more uniform, whose diameter is greater, and which does not contain impurities emitted from the expanding chamber wall.

Figure 12:
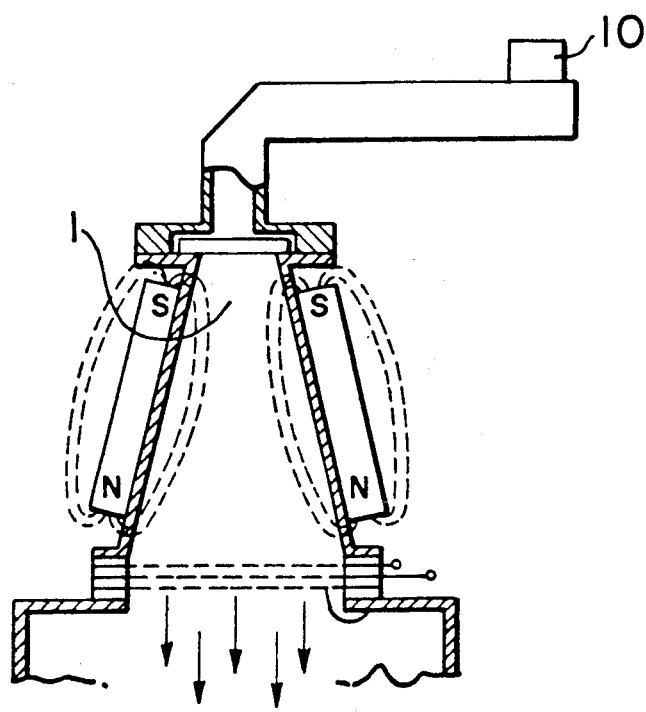
FIGS. 12 and 13 are other examples of the arrangement of the permanent magnets in the embodiment shown in FIG. 6.

Although the apparatus shown in FIG. 12 is similar to that shown in FIG. 6, the permanent magnets are arranged such that the direction of magnetization of the permanent magnets is aligned with the wall surface of the plasma chamber. In this case, the installation of the permanent magnets is simple, and the apparatus can be made compact.

Figure 13:
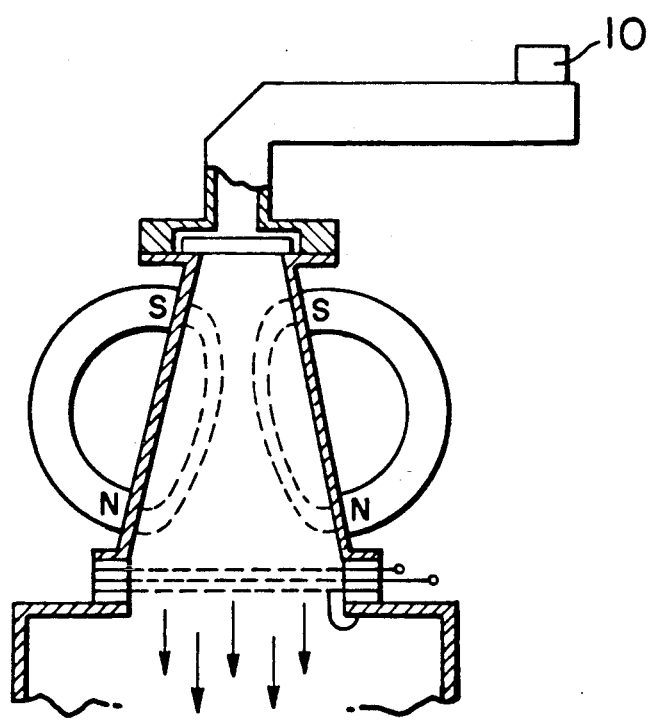

The apparatus shown in FIG. 13 also has a different arrangement of the permanent magnets. Since semicircular or U-shaped permanent magnets are used, the amount of leaking magnetic fluxes is small, and the magnetic fields inside the plasma generating chamber become stronger, thereby improving the efficiency at which the plasma is produced.

Figure 14:
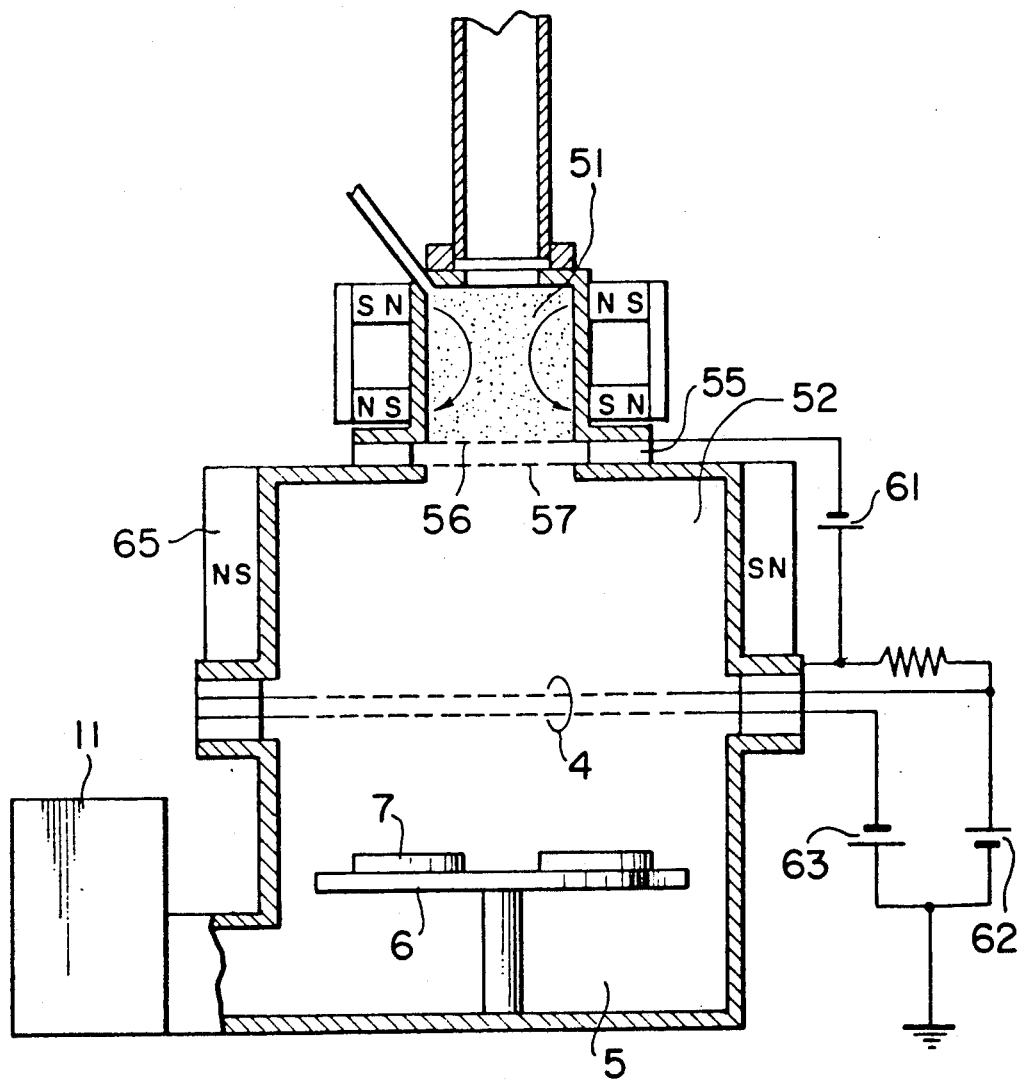
FIG. 14 is a vertical cross-sectional view of an embodiment in which two plasma chambers are provided.

FIG. 14 illustrates still another embodiment of the present invention, in which two plasma generating chambers are provided, and the plasma is generated separately in each of the chambers. In FIG. 14, the arrangement and operation of a plasma generating chamber 51 are substantially identical with those of the plasma chamber 1 of the apparatus shown in FIG. 1. A main plasma chamber 52 is provided below the plasma chamber 51.

Inserted between the two chambers is an insulator 55 which maintains electrical insulation therebetween and keeps the interiors thereof air-tightly, and a power supply 61 is provided in such a manner as to provide a potential difference between the two chambers.

Multiaperture or mesh-like electrodes 56, 57 for extracting electrons are provided between the plasma chamber 51 and the main plasma chamber 52, and electrical conductance is maintained between the electron extraction electrode 56 and the plasma chamber 51 and between the electron extraction electrode 57 and the main plasma chamber 52.

Meanwhile, a extraction electrode group 4 constituted by one or a plurality of multiaperture electrodes having a multiplicity of holes for the purpose of extracting ion beams is provided between the main plasma chamber 52 and a vacuum vessel 5, appropriate potentials are applied to the extraction electrode group 4 by power supplies 62, 63.

Furthermore, if a potential difference is imparted by the power supply 61 to the electron extraction electrodes 56, 57 in such a manner that the potential of the plasma chamber 51 becomes negative relative to the main plasma chamber 52, the electrons in the plasma generated in the plasma chamber 51 are accelerated between the electron extraction electrodes 56, 57 and are made incident into the main plasma chamber 52. Since the interior of the main plasma chamber 52 has substantially no electric field, the electrons inertially fly and collide against the molecules of the gas in the main plasma chamber 52 so as to ionize the same. Thus, the plasma is formed inside the main plasma chamber 52 with substantially no electrical field applied thereto, and ions move mainly by means of diffusion. If appropriate potentials (generally, $-200$ to $-500$ V and 1,000 V or less, respectively) are applied to the ion beam extraction electrode group 4 by the power supplies 62, 63, it is possible to effect processing of the substrates 7 by extracting the ions in the form of beams from the plasma in the main plasma chamber 52.

Since the arrangement is such that permanent magnets 65 are arranged annularly around an outer periphery of the main plasma chamber 52 with the north pole and the south pole arranged alternately in a face-to-face relationship with the side of the main plasma chamber 52, cusp magnetic fields are formed in the main plasma chamber 52, so that the plasma in the main chamber 52 can be confined in by means of the cusp magnetic fields. As a result, a loss of the plasma on the wall surface of the plasma chamber can be reduced, and the generated plasma can be effectively used.

Figure 15:
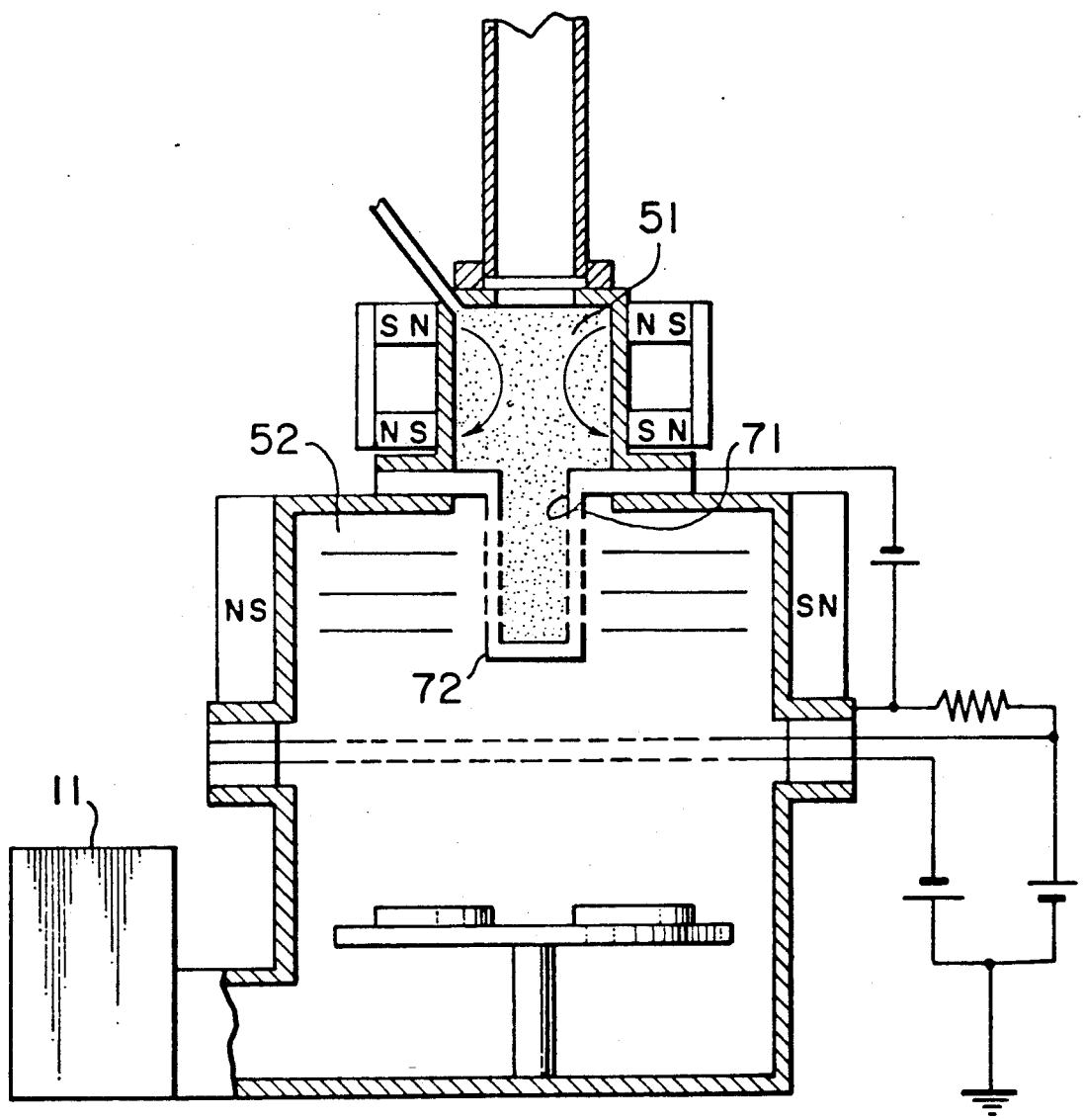
FIG. 15 is a vertical cross-sectional view of a modification which is similar to the embodiment shown in FIG. 14.

The apparatus shown in FIG. 15 is characterized in that electron extraction electrodes 71, 72 for extracting the electrons from the plasma chamber 51 to the main plasma chamber 52 are formed into a convex shape projecting into the main plasma chamber 52 to allow the electrons to be extracted radially. If this arrangement is made, the directions of the electrons oriented toward the side wall of the main plasma chamber 52 are changed by the cusp magnetic fields formed in the vicinity of the wall surface, and the probability of the electrons colliding against the molecules of the gas increases, so that there is an advantage in that high density plasma is generated in the main plasma chamber 52.

In accordance with the embodiments shown in FIGS. 14 and 15, the plasma is ionized by the electron beams, and the temperature of the ions is extremely low at approximately 0.1 eV of 1/100 as compared with 10 ev for conventional microwave plasma. Accordingly, no harmful collision of the ions against the substrates 7 takes place, so that there is an advantage in that it is possible to prevent damage from being caused to the thin films of the substrates 7 owing to the overcollision of the ions against the thin films.

Although, in the embodiments shown in FIGS. 14 and 15, positive ion beams are extracted from the plasma in the main plasma chamber 52 by using the extraction electrodes 4 and are radiated to the workpieces, the workpiece may be arranged inside the main plasma chamber, and the plasma itself may be used instead of ion beams. In this case, if an AC voltage is applied to the workpiece via a capacitor, since the amounts of charges of the electrons and ions in the plasma are equal and the electrons are lighter in weight and have a high mobility, the workpiece gradually assumes a negative potential, so that etching can be accelerated. In addition, when the thin films are to be deposited, it is also effective in accelerating the deposition to maintain the workpiece at a certain high temperature.

Having described specific embodiments of our plasma generating apparatus, it is believed obvious that modification and variation of our invention is possible in light of the above teachings.

What is claimed is:

1. A plasma generating apparatus comprising:
   a microwave generator for generating microwaves,
   a waveguide connected to said microwave generator,
   a plasma generating chamber connected to said waveguide and having a longitudinal axis extending in substantially the same direction as an advancing direction of said microwaves,
   means for generating lines of magnetic force in said plasma generating chamber so that guidelines extending in substantially the same direction as said longitudinal axis of said plasma generating chamber, said generating means including a plurality of first permanent magnets provided around an outer periphery of a wall of said plasma generating chamber, said plurality of first permanent magnets being disposed so as to generate the lines of magnetic force extending in substantially the same direction as said longitudinal axis of said plasma generating chamber,
   a pair of extraction electrodes disposed in said plasma generating chamber,
   DC power supplies for supplying potentials to said extraction electrodes, and a vacuum vessel connected to said plasma generating chamber,
   whereby a plasma having a substantially uniform distributed density is generated.

2. A plasma generating apparatus as claimed in claim 1, wherein said plasma generating chamber is flared toward said vacuum vessel.

3. A plasma generating apparatus as claimed in claim 1, further comprising:
   a plasma expanding chamber provided underneath said plasma generating chamber, and
   means for forming cusp magnetic fields including a plurality of second permanent magnets provided around an outer periphery of said plasma expanding chamber to present alternate polarities so as to form cusp magnetic fields in a peripheral portion of said plasma expanding chamber.

4. A plasma generating apparatus comprising:
   a microwave generator for generating microwaves,
   a waveguide connected to said microwave generator,
   a sub-plasma generating chamber connected to said waveguide and having a longitudinal axis extending in substantially the same direction as an advancing direction of said microwaves,
   means for generating lines of magnetic force in said sub-plasma chamber extending in substantially the same direction as said longitudinal axis of said sub-plasma generating chamber, said generating means including a plurality of first permanent magnets provided around an outer periphery of a wall of said sub-plasma generating chamber, said plurality of first permanent magnets being disposed so as to generate the lines of magnetic force extending in substantially the same direction as said longitudinal axis of said sub-plasma generating chamber,
   a main-plasma generating chamber provided below said sub-plasma generating chamber,
   an insulator inserted between said sub- and main-plasma generating chambers for maintaining electrical insulation therebetween,
   means for forming cusp magnetic fields including a plurality of second permanent magnets provided around an outer periphery of said main-plasma generating chamber to present alternate polarities so as to form cusp magnetic fields in a peripheral portion of said main-plasma generating chamber,
   a pair of first electrodes provides between said sub- and main-plasma generating chambers, one of said first electrodes being electrically connected to said sub-plasma generating chamber and the other being electrically connected to said main-plasma generating chamber,
   DC power supplies for applying potentials to said pair of first and second electrodes, and
   a vacuum vessel connected to said main-plasma generating chamber,
   whereby a plasma having a substantially uniform distributed density is generated.

5. A plasma generating apparatus as claimed in claim 4, wherein said pair of first electrodes are formed into a convex shape projecting into said main-plasma generating chamber.

6. A plasma generating apparatus as claimed in claim 4, wherein said sub-plasma generating chamber has a negative potential relative to said main-plasma generating chamber.

7. A plasma generating apparatus as claimed in claim 5, wherein said sub-plasma generating chamber has a negative potential relative to said main-plasma generating chamber.

8. A plasma generating apparatus comprising:
   a plurality of microwave generators for generating microwaves,
   a plurality of waveguides respectively connected to said microwave generators,
   a plurality of preliminary plasma chambers respectively connected to said plurality of waveguides each of said preliminary plasma chambers having a longitudinal axis extending in substantially the same direction as an advancing direction of said microwaves,
   a plasma generating chamber connected to said plurality of preliminary plasma chambers,
   means for generating lines of magnetic force in said preliminary plasma chambers extending in substantially the same direction as said longitudinal axis of said preliminary plasma chambers, said generating means including a plurality of first permanent magnets provided around an outer periphery of a wall of said preliminary plasma chambers, said first plurality of permanent magnets being disposed so as to generate the lines of magnetic force extending in substantially the same direction as said longitudinal axis of said preliminary plasma chambers, means for forming cusp magnetic fields including a plurality of second permanent magnets provided around an outer periphery of a wall of said plasma generating chamber to present alternate polarities so as to form cusp magnetic fields in a peripheral portion of said plasma generating chamber, a pair of extraction electrodes disposed in said plasma generating chamber, DC power supplies for applying potentials to said extraction electrodes, and a vacuum vessel connected to said plasma generating chamber, whereby a plasma having a substantially uniform distributed density is generated.

* * * * *